United States Patent
Seidler et al.

(10) Patent No.: US 7,262,532 B2
(45) Date of Patent: Aug. 28, 2007

(54) ARRANGEMENT WITH AN ELECTRONICALLY COMMUTATED EXTERNAL ROTOR MOTOR

(75) Inventors: Siegfried Seidler, Villingen-Schwenningen (DE); Francisco Rojo Lulic, St. Georgen (DE); Wolfgang Laufer, Aichhalden (DE)

(73) Assignee: ebm-papst St. Georgen GmbH & Co. KG, St. Georgen (DE)

( * ) Notice: Subject to any disclaimer, the term of this patent is extended or adjusted under 35 U.S.C. 154(b) by 0 days.

(21) Appl. No.: 10/580,143

(22) PCT Filed: Feb. 15, 2005

(86) PCT No.: PCT/EP2005/001491

§ 371 (c)(1),
(2), (4) Date: May 18, 2006

(87) PCT Pub. No.: WO2005/095802

PCT Pub. Date: Oct. 13, 2005

(65) Prior Publication Data

US 2007/0075597 A1    Apr. 5, 2007

(30) Foreign Application Priority Data

Mar. 16, 2004   (DE) ................. 20 2004 004 442 U

(51) Int. Cl.
*H02K 49/00*  (2006.01)
*H02K 49/10*  (2006.01)
*H02K 5/12*   (2006.01)
*H02K 5/128*  (2006.01)
*F04D 13/02*  (2006.01)

(52) U.S. Cl. .............. 310/103; 310/91; 310/104; 310/112; 310/114; 417/420; 417/423.11; 417/423.12

(58) Field of Classification Search ............. 310/88, 310/91, 103, 104, 112, 114; 417/420, 423.8, 417/423.11, 423.12, 423.14; *F04D 13/02, F04D 13/06*
See application file for complete search history.

(56) References Cited

U.S. PATENT DOCUMENTS 4,115,040 A * 9/1978 Knorr ..................... 417/420
(Continued)

FOREIGN PATENT DOCUMENTS

DE         42 38 132          5/1994
(Continued)

OTHER PUBLICATIONS

Gebr. Reinfurt GmbH & Co. KG, "Small and Miniature Ball Bearings" catalog, Wurzburg, Germany 2006, re GRW bearings mentioned in present specification.

*Primary Examiner*—Tran Nguyen
(74) *Attorney, Agent, or Firm*—Milton Oliver, Esq.; Ware Fressola Van Der Sluys & Adolphson LLC

(57) ABSTRACT

A motor structure resistant to liquid intrusion features two modules, the first having an electronically commutated external-rotor motor (20), which motor comprises an internal stator (22) that is arranged on a bearing tube (30) and is separated by a first air gap (24) from an external rotor (26; 92), which latter comprises a rotor cup (40) that is open at one end and is joined at its other end to a shaft (46) that is journalled in the bearing tube (30), further having a permanent-magnet arrangement (76), arranged at the open end of the rotor cup (40), for magnetic interaction with a second permanent-magnet rotor (92), forming part of the second module. The first module is separated from that second rotor (92) by a second air gap and forms therewith a magnetic coupling (94), so that a rotation of the permanent-magnet arrangement (76) brings about a rotation of that second rotor (92). A hermetic separation of the two modules is accomplished using a non-ferromagnetic separating element (82) arranged in the second air gap. The second module can safely be used to handle liquid, e.g. as a pump.

24 Claims, 6 Drawing Sheets

U.S. PATENT DOCUMENTS

| | | | |
|---|---|---|---|
| 4,752,194 A * | 6/1988 | Wienen et al. | 417/420 |
| 4,890,988 A * | 1/1990 | Kramer et al. | 417/372 |
| 5,017,102 A * | 5/1991 | Shimaguchi et al. | 417/420 |
| 5,090,944 A * | 2/1992 | Kyo et al. | 464/29 |
| 6,208,512 B1 | 3/2001 | Goldowsky et al. | 361/699 |
| 6,600,649 B1 | 7/2003 | Tsai et al. | 361/697 |
| 6,672,818 B1 | 1/2004 | Terracol | 412/420 |
| 6,841,909 B2 * | 1/2005 | Six | 310/103 |
| 6,938,776 B2 | 9/2005 | Rem | 209/13 |
| 2003/0099561 A1 | 5/2003 | Heydt et al. | 417/423.1 |

FOREIGN PATENT DOCUMENTS

| | | |
|---|---|---|
| FR | 2 598 047 | 10/1987 |
| JP | 57-108492 | 7/1982 |
| JP | 01-294 990 | 11/1989 |
| JP | 02-045 691 | 2/1990 |
| JP | 06-241 185 | 8/1994 |
| JP | 08151994 A * | 6/1996 |
| JP | 09-163 675 | 6/1997 |
| JP | 09268994 A * | 10/1997 |
| JP | 2000-374 399 | 10/2000 |
| JP | 2002155883 A * | 5/2002 |
| JP | 2003254280 A * | 9/2003 |
| WO | WO 01-18401 | 3/2001 |

* cited by examiner

ARRANGEMENT WITH AN ELECTRONICALLY COMMUTATED EXTERNAL ROTOR MOTOR

FIELD OF THE INVENTION

The invention relates to an arrangement having an electronically commutated external-rotor motor.

BACKGROUND

Thanks to their simple design, great reliability, and long service life, motors of this kind are used nowadays for a wide variety of drive functions.

Typical applications are as drives for so-called equipment fans that are used to remove heat from computer housings, also as drives for small fans for direct cooling of microprocessors, drives for vacuum cleaners, etc.

When an external-rotor motor of this kind is used for combined drive functions, the problem exists that although a compact design is desirable, on the other hand the motor must not be negatively affected by a part that is to be driven. For example, if this motor is driving a liquid pump or a compressor, no medium from the pump or compressor can be permitted into the motor, since that medium might otherwise damage the electronic systems of the motor or cause corrosion or the like in it.

SUMMARY OF THE INVENTION

It is therefore an object of the invention to provide a motor structure with first and second rotor modules hermetically separated from each other, but magnetically coupled together.

According to the invention, this object is achieved by providing a first external rotor separated by a first air gap from an internal stator, on one side of a liquid-tight non-ferromagnetic separating element, coupled magnetically to a second external rotor on the other side of a second air gap, in which the separating element is located. A compact design is thereby obtained: the non-ferromagnetic separating element, in addition to its magnetic and mechanical separating function in the second air gap, can additionally act as a carrier of the shaft for journalling the second rotor, and as a carrier for the bearing tube of the external-rotor motor. This allows a design having few parts, as well as simple and economical installation. It also allows tight production tolerances and, as a result, quiet running and a long service life.

An essential aspect of the invention is enhancement of the integrity of the unit made up of the external-rotor motor, magnetic coupling, and driven element (e.g. pump or compressor). This is attained by the consistent application of modern technological capabilities in order to achieve minimized manufacturing costs, excellent process reliability during manufacture, minimized imbalance in particular of the external rotor but also of the second rotor, and a minimization of parts count and production costs.

BRIEF FIGURE DESCRIPTION

Further details and advantageous refinements of the invention are evident from the exemplifying embodiment, in no way to be understood as a limitation of the invention, that is described below and depicted in the drawings.

Figure 1:
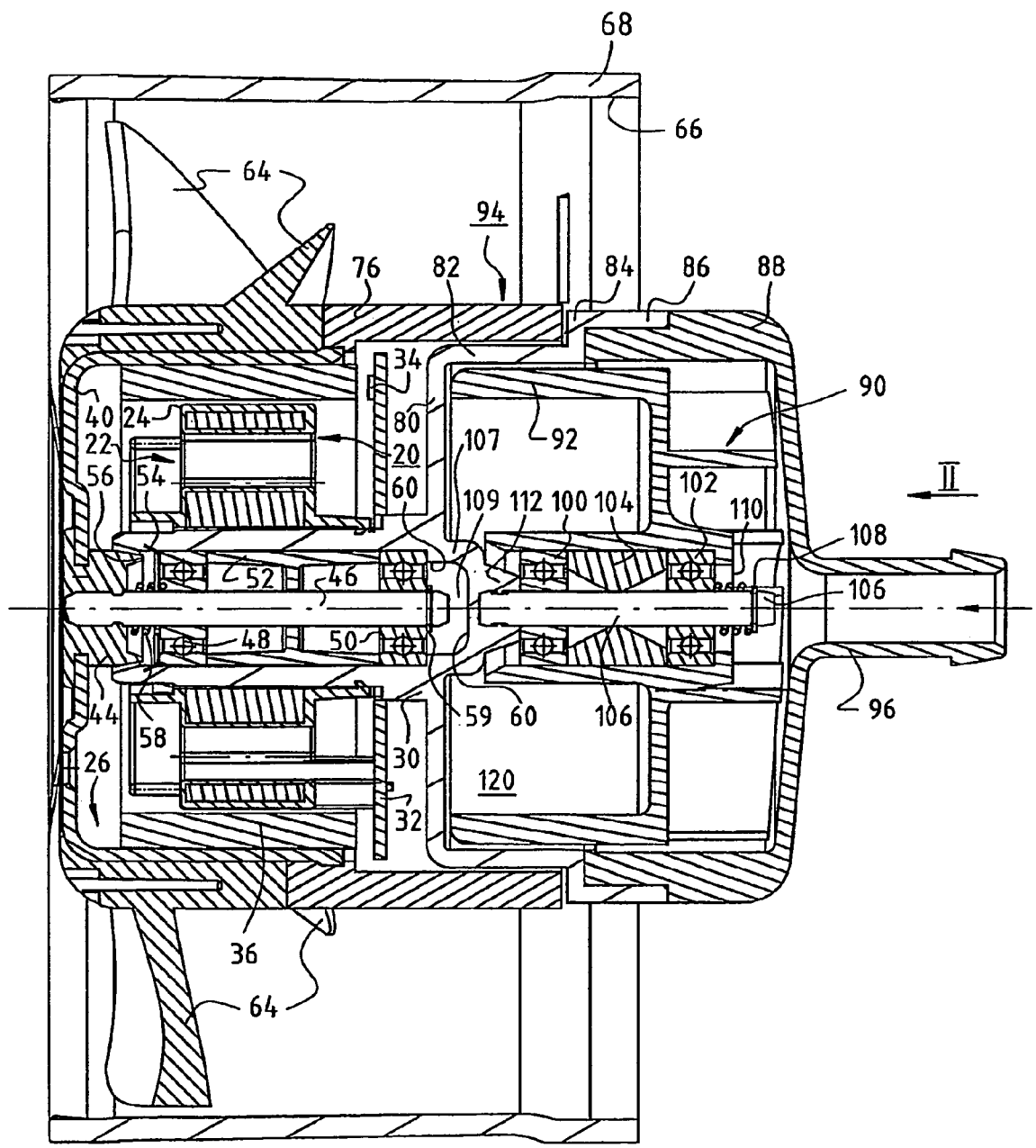
FIG. 1 is a longitudinal section, enlarged approximately twice, through an arrangement according to a preferred implementation of the invention, looking in the direction of line I-I of FIG. 2.

In the description that follows, the terms "left," "right," "top," and "bottom" refer to the respective Figure. Identical or identically functioning parts are labeled in the various Figures. with the same reference characters, if applicable with an appended apostrophe, e.g. 26' rather than 26, and are usually described only once.

DETAILED DESCRIPTION

FIG. 1 shows, at approximately twice actual size, an arrangement having an electronically commutated external-rotor motor 20. The latter has an internal stator 22 of conventional design, e.g. a stator having salient poles or a claw pole stator, and the latter is separated from an external rotor 26 by a substantially cylindrical air gap 24. During operation, external rotor 26 rotates about internal stator 22, this being the reason that such motors 20 are referred to as external-rotor motors.

Internal stator 22 is mounted on a bearing tube 30, usually by being pressed on. A circuit board 32 is located to the right of internal stator 22. Located on this board are the electronic components (not shown here) that are needed for electronic commutation of motor 20, as well as a rotor position sensor 34 that is controlled by a permanent ring magnet 36 of external rotor 26. Ring magnet 36 is radially magnetized, and preferably has four rotor poles. Sensor 34 is controlled by a leakage field of this ring magnet 36, enabling non-contact sensing of the position of rotor 34.

External rotor 26 has a design using a so-called rotor cup 40, which is implemented here as a deep drawn cup-shaped sheet-metal part made of soft ferromagnetic material. Ring magnet 36 is mounted in this sheet-metal part 40 so that the latter constitutes a magnetic yoke for rotor magnet 36.

Sheet-metal part 40 has a hub 44 in which a shaft 46 is mounted in the manner depicted. It is journalled in two ball bearings 48, 50 whose outer rings are held at a distance from one another by a spacer 52 (cf. also the schematic depictions in FIGS. 4 and 5). These ball bearings 48, 50, together with shaft 46, are pressed from the left into bearing tube 30 upon assembly, and retained there by a latching member 54. An axial projection 56 of flange part 44 is used to press in latching member 54. Located between said part and the inner ring of rolling bearing 48 is a compression spring 58 that, after assembly, pushes rotor 26 sufficiently far to the left that a snap ring 59 mounted at the right end of shaft 46 makes contact against the inner ring of rolling bearing 50. Shaft 46 is therefore displaceable in the inner rings of the two rolling bearings 48, 50.

This mounting method makes it possible to install rotor 26, together with its completely preassembled bearings 48, 50, from the left into bearing tube 30, so that right end 60 of the inner opening of bearing tube 30 can be closed off, as shown, in liquid-tight fashion. This mounting method will be explained in further detail with reference to the Figures. that follow.

Fan blades 64 are secured by plastic injection molding, in the manner depicted, on the exterior of sheet-metal part 40. During operation, they rotate in an opening 66 of a fan housing 68 (cf. FIG. 2). Fan housing 68 has, for example, the usual square shape of an equipment fan, and has a mounting hole 70 in each of its corners.

Also mounted on the exterior of sheet-metal part 40 by plastic injection molding is an annular extension 76 made of a plastic material having embedded particles of hard ferrite. This is referred to as a plastic-matrix ferrite magnet, from which rotor magnet 36 can also be manufactured.

This ferrite magnet 76 is manufactured in a corresponding injection-molding tool, and in a second process step, if applicable in the same injection-molding tool, the actual fan wheel with its blades 64 can be injection-molded around component 40. A procedure of this kind is referred to as a "2K" (=two plastics) method. With this procedure, in particularly advantageous fashion, it is possible to minimize manufacturing costs, the "original imbalance" that can be achieved, the number of process steps, and the logistical outlay for manufacture. Alternatively, a hard ferrite ring magnet could also be mounted separately on sheet-metal part 40, e.g. by being adhesively bonded or pressed on.

Bearing tube 30 transitions to the right into a flange-like portion 80 that proceeds perpendicular to the rotation axis of rotor 26 and transitions at its periphery into a cylindrical portion 82, which here has the function of a so-called gap tube and is therefore referred to hereinafter as gap tube 82. The right end of ferrite magnet 76 extends around the exterior of gap tube 82 and parallel to it.

Gap tube 82 transitions via a shoulder 84 into a cylindrical portion 86 that, as depicted, serves for mounting of a cover 88, for example by means of a threaded mount (not depicted) or a sealing ring (not depicted), or by laser welding. Cover 88 can also be referred to as spiral housing 88, since in its interior there is a spiral-shaped housing contour in which a conveying wheel 90 is arranged.

Figure 2:
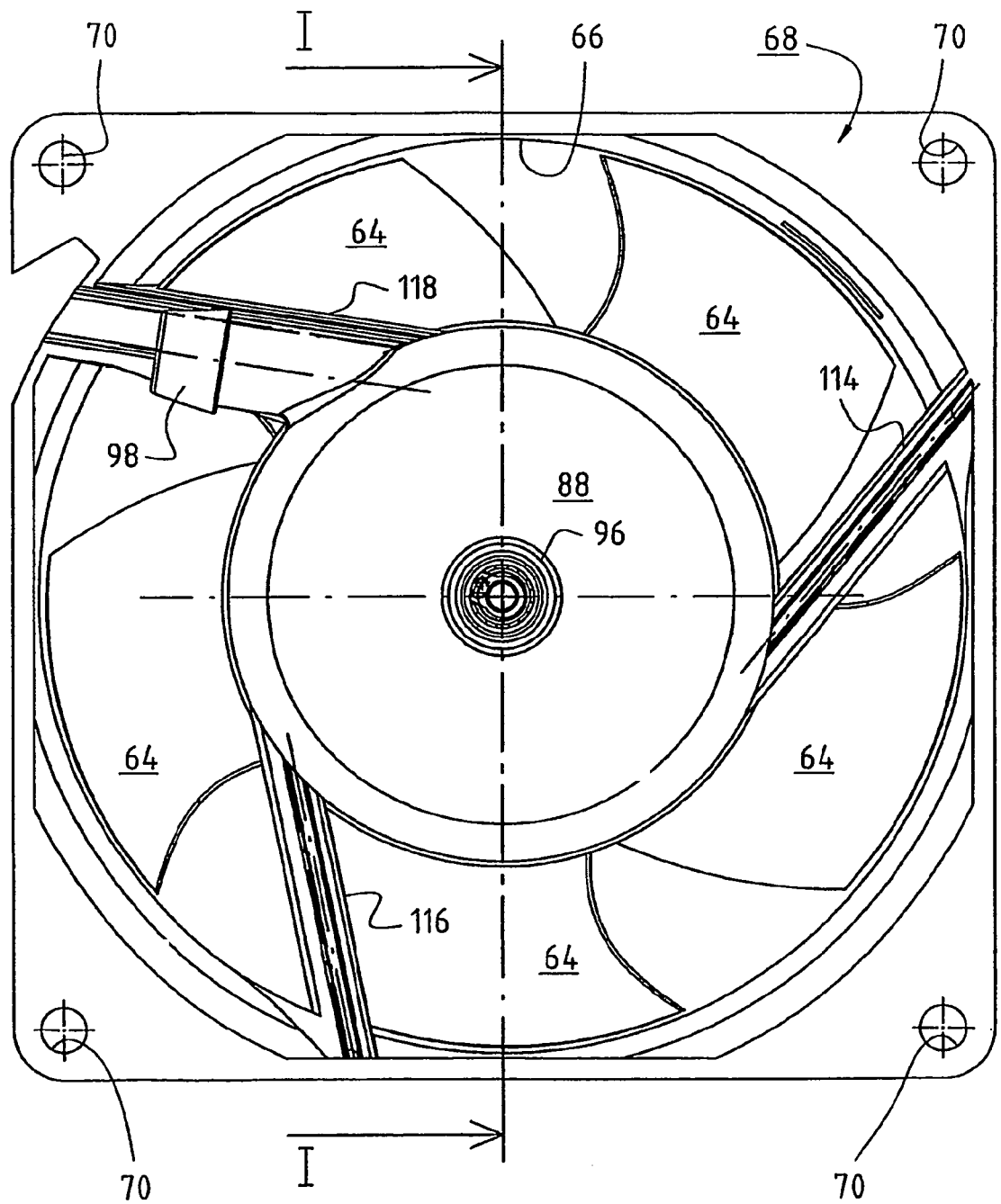
FIG. 2 is a plan view looking in the direction of arrow II of FIG. 1.
Figure 3:
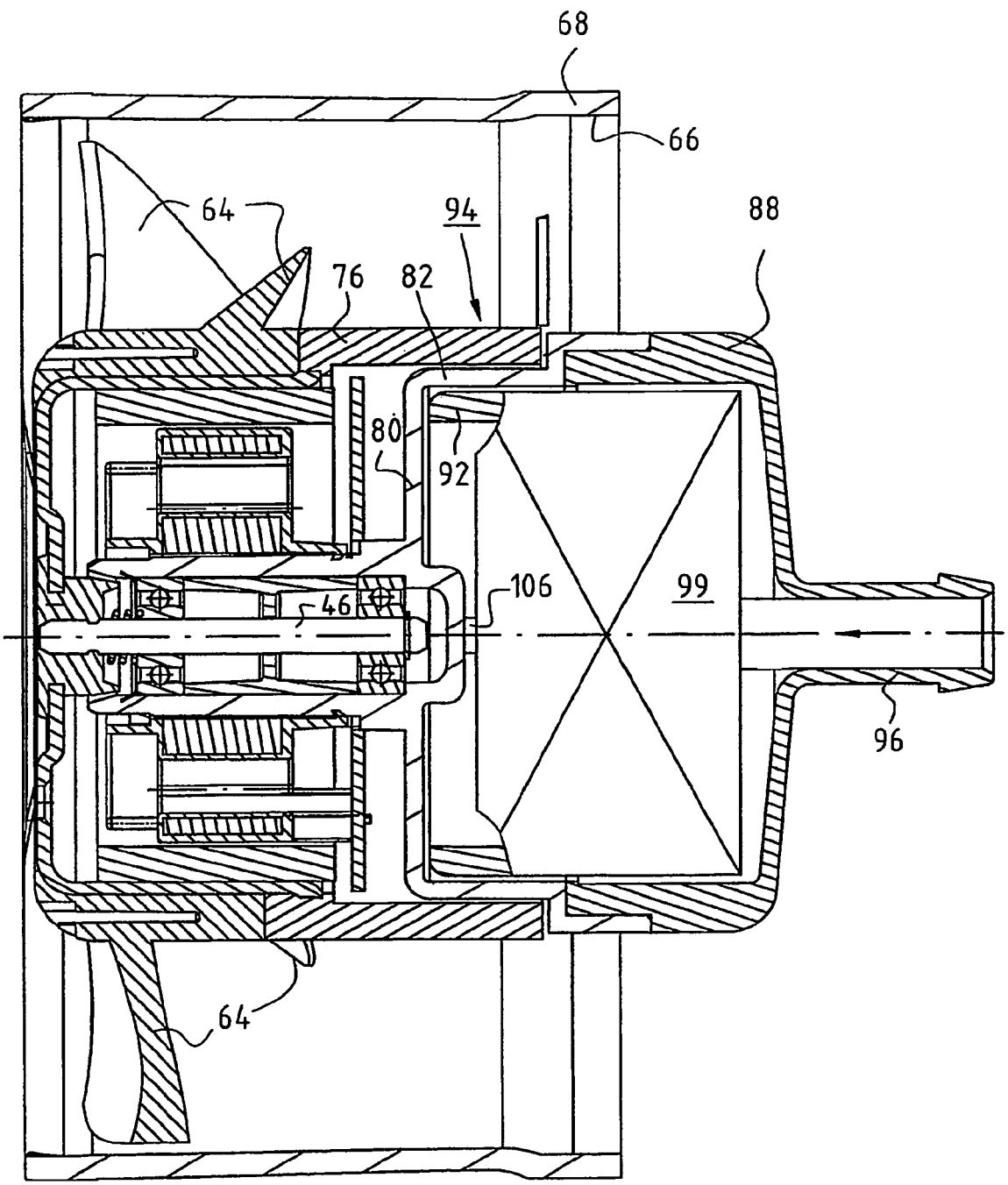
FIG. 3 is a variant of FIG. 2 in which a compressor 99, e.g. a piston pump, is used instead of a centrifugal pump.

The latter is preferably implemented integrally with a permanent-magnet rotor 92 that is separated by gap tube 82 from ferrite magnet 76 and forms with the latter a magnetic coupling 94; in other words, when ferrite magnet 76 rotates, rotor 92 also rotates and thereby drives conveying wheel 90, with the result that the latter draws in liquid via an inlet 96 and pumps it out via an outlet 98 (FIG. 2). It is self-evident that instead of a spiral pump, any other unit to be driven can also be provided, for example a compressor 99 for a refrigerating agent, as shown in FIG. 3. Compressor 99 is also driven via a magnetic coupling 94 that can be constructed identically to the one in FIG. 1.

Permanent-magnet rotor 92 is rotatably journalled, by means of two rolling bearings 100, 102 between whose outer rings a spacing member 104 is located, on a stationary shaft 106 that is mounted in liquid-tight fashion, in the manner depicted, in a projection 107, protruding to the right, of portion 80. Mounted on the right end of shaft 106 is a snap ring 108, and located between the latter and the inner ring of rolling bearing 102 is a compression spring 110 that imparts an axial preload to the two rolling bearings 100, 102. The inner ring of left rolling bearing 100 is braced against an axial projection 112 of projection 107. Projection 107 is hollow on its left side, and forms there the right end 60 of the internal opening of bearing tube 30. The method depicted here for mounting bearings 48, 50 requires an open space 109 between the right end of shaft 46 and the bottom of opening 60, and the configuration having projection 107 makes possible, despite this open space 109, an axially compact design in which the space in the unit is effectively utilized.

Cylindrical portion 86 is joined via struts 114, 116, 118 to fan housing 68, so that the latter constitutes an integral part with gap tube 82, portion 80, and bearing tube 30; this greatly simplifies installation of the arrangement, keeps the parts count low, and reliably separates from one another the units that are used, so that liquid cannot travel from spiral wheel 90 to motor 20 and damage it. Stationary shaft 106 likewise constitutes a component of this injection-molded part because it becomes anchored in it during manufacture, and thus likewise contributes to the compact design.

MODE OF OPERATION

During operation, external-rotor motor 20 drives external rotor 26 so that fan blades 64 rotate in housing 68 and thereby, in known fashion, generate an axial air flow therein. Alternatively, the fan can also, for example, be implemented as a diagonal fan or radial fan. An axial fan is shown. The fan design that is used depends on the requirements.

At the same time, ferrite ring magnet 76, which can be magnetized e.g. with six or eight poles, drives rotor magnet 92 (which in this case will likewise be magnetized with six or eight poles) through gap tube 82, and thus rotates conveying wheel 90 so that the latter draws in liquid through inlet 96 and pumps it out through outlet 98 (FIG. 2). Such an arrangement can be used, for example, in order to draw in water in a well and pump it out; or to pump blood in a heart-lung machine; or to transport cooling fluid in a closed cooling circuit, in which case conveying wheel 90 then has the function of a circulating pump.

Because cover 88 is joined in liquid-tight fashion to gap tube 82, for example by laser welding, no liquid can escape outward from housing 88; a principal contributing factor here is that flange-like portion 80 and its projection 107 have no openings of any kind. This is possible because external rotor 26 can be securely installed from the left, for example in the manner described below with reference to FIGS. 4 and 5, since it is not necessary to have access to the right end of shaft 46 during installation. Conveying wheel 90 of the centrifugal pump, with its bearings 100, 102, can similarly be installed on stationary shaft 106 from the right, and secured with snap ring 108, before cover 88 is mounted.

For bearings 100, 102, it is preferred to use so-called hybrid bearings. These have balls made of ceramic and bearing rings made of a corrosion-resistant special-steel alloy. They are manufactured, for example, by the GRW company and are used especially for blood pumps and dental drills. With such bearings, the desired service life is obtained even in unusual media.

As an alternative to FIG. 1, it is possible to provide, for the journalling of conveying wheel 90, a rotating shaft that, exactly like shaft 46 of motor 20, is journalled in a bearing tube (not depicted) that then, like bearing tube 30, is implemented integrally with portion 80 and protrudes to the right from it, i.e. in mirror-image fashion with respect to bearing tube 30. With this variant, installation is performed in the same way as described for the installation of external rotor 26, i.e. by pressing into that bearing tube (not depicted). Installation in this fashion proceeds more quickly than the installation of spring 110 and snap ring 108 in the version according to FIG. 1, since pre-assembly in this case can occur outside the pump in a special apparatus, and can be largely automated.

In this case as well, stator 22 of external-rotor motor 20 can be sealed in fluid-tight fashion. This can be done by insert-molding with polyurethane or with hot-melt adhesive. In this case the stator can be mounted in the cavity labeled 120 in FIG. 1 on the bearing tube described (as a variant) in the previous paragraph, and can directly drive rotor 92 of magnetic coupling 94. Fan wheel 64 is, in this case, driven via a magnetic coupling, i.e. in this case ring magnet 76 directly drives blades 64 of the fan. This enables an even more compact design, since in this case cavity 120 is filled up by the internal stator of the external-rotor motor. It is then also possible to journal fan wheel 64 at its outer circumference in a bearing directly in housing 68, as is occasionally the practice with such fans. What then results from this is an extraordinarily short design, which is required in many devices. In this case blades 64 are connected at their periphery by a ring.

Figure 4:
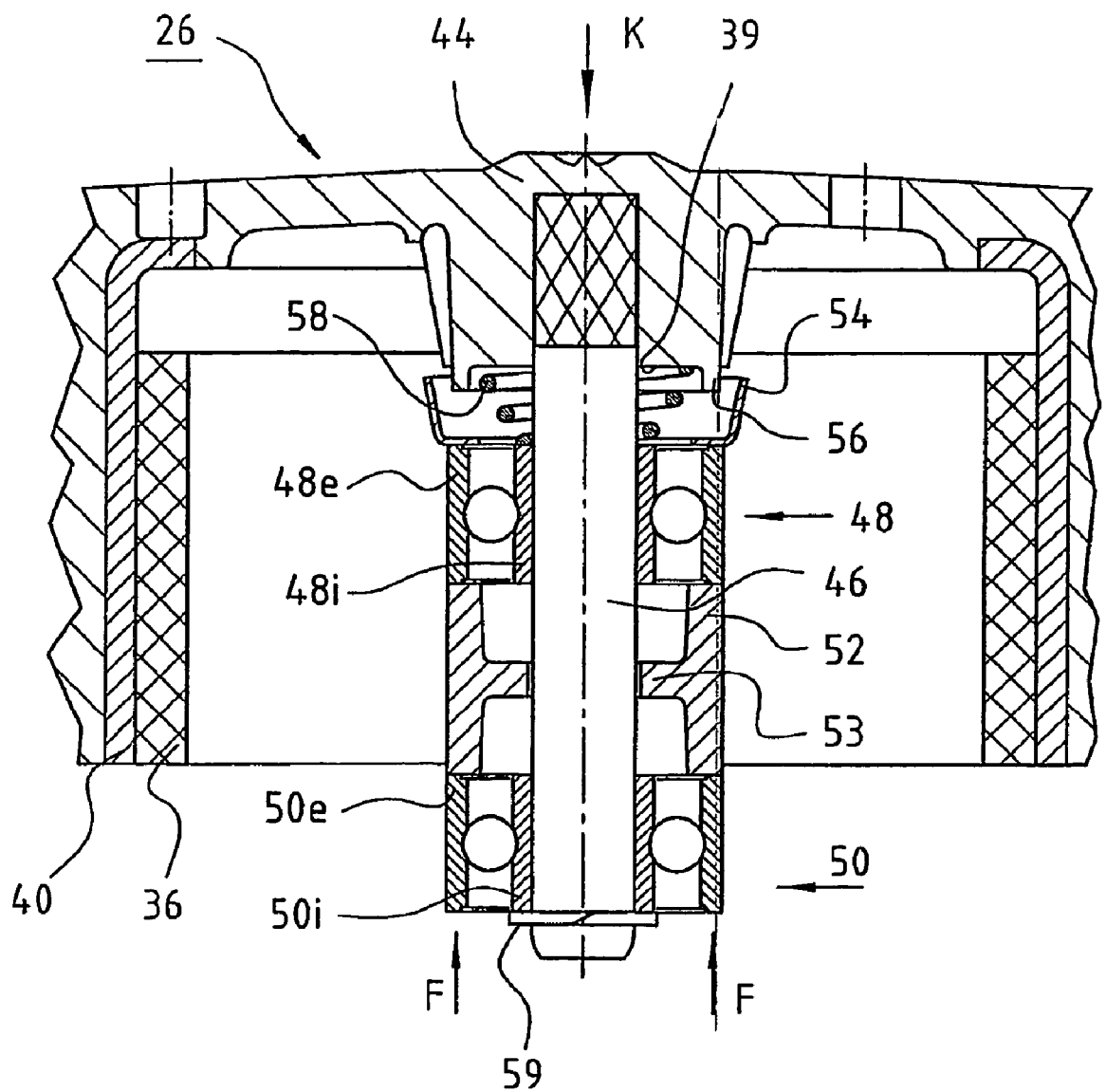
FIG. 4 is a first depiction to explain how the rolling bearings of the external rotor are assembled in the case of the arrangement according to FIGS. 1 and 2.

According to FIG. 4, which differs slightly from FIG. 1, various components are preinstalled on shaft 46 prior to the assembly of motor 20.

Beginning with projection 56, these are firstly compression spring 58 of preferably conical shape, whose larger-diameter end rests in a depression 39.

Spring 58 is followed below by the annular securing member in the form of securing washer 54. Spring 58 preferably does not rest against this securing member 54.

Securing member 54 is followed by rolling bearing 48 with its outer ring 48e and its inner ring 48i. The latter is displaceable in an axial direction on shaft 46. The lower end of spring 58 rests against the upper end of inner ring 48i. Rolling bearing 48 is followed by spacer 52, which is guided displaceably on shaft 46 by means of a radially inwardly protruding projection 53, and whose upper end, as depicted, rests against the lower end of outer ring 48i.

Spacer 52 is followed by lower rolling bearing 50, with its outer ring 50e that rests with its upper end against spacer 52, and with its inner ring 50i that is displaceable in an axial direction on shaft 46 and rests with its lower end against snap ring 59, as depicted, when motor 20 is completely assembled.

It is readily apparent that, if one pushes upwardly with a force F on lower rolling bearing 50, spring 58 can be compressed and the two bearings 48, 50, spacer 52, and securing washer 54 can thereby be displaced upward on shaft 46, so that inner ring 50i is no longer resting against snap ring 59 but ends up at a distance from it. In this case, projection 56 of rotor 22 comes to rest against securing washer 54 and makes it possible, by means thereof, to transfer an axial force in a distal direction to securing washer 54, outer ring 48e, spacer 52, and outer ring 50e when rotor 26 is pushed downward by a force K during installation. This is depicted below in FIG. 5.

Figure 5:
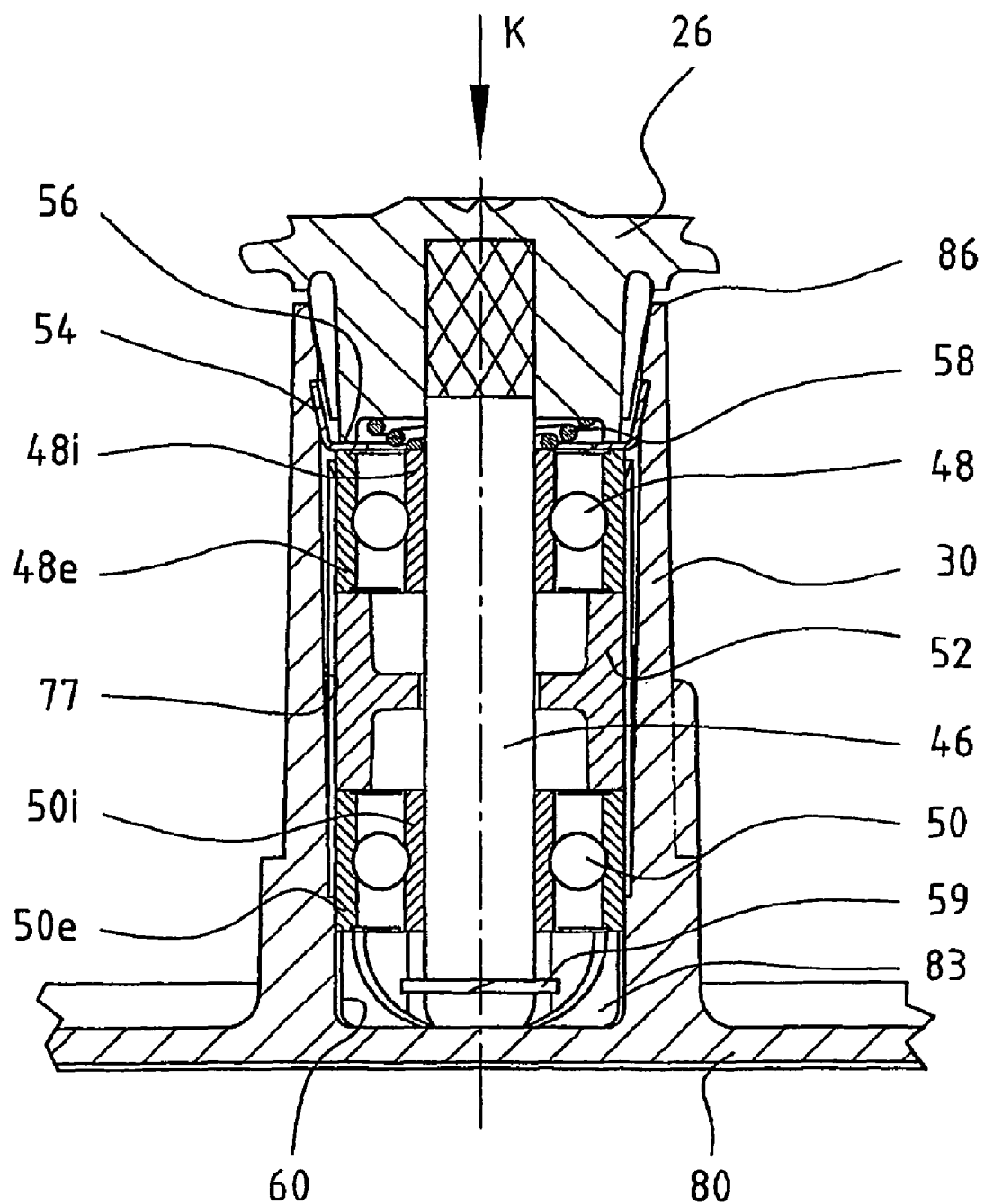
FIG. 5 is a second depiction showing the bearings in a state shortly before assembly is completed.

FIG. 5 shows, so to speak, a snapshot during the "mating" procedure in which shaft 46 of rotor 26, with rolling bearings 48, 50 present thereon, is introduced for the first time into internal opening 77 of bearing tube 30.

In this, a force K is applied in an axial direction onto rotor 26; and because outer rings 48e, 50e of rolling bearings 48, 50 are pressed with a press fit into ribs of bearing tube 30, spring 58 is compressed by the force K so that shaft 46 shifts in a distal direction in ball bearings 48, 50, and projection 56 impinges via securing washer 54 on outer ring 48e of ball bearing 48, and via spacing member 52 also on outer ring 50e of ball bearing 50, thus pressing both ball bearings 48, 50 into bearing tube 30. As depicted in FIG. 5, spring 58 is only partially compressed in this context, in order to avoid damaging it.

This pressing-in operation continues until outer ring 50e of lower ball bearing 50 is resting against the upper end of ribs 83 that are provided in bearing tube 30 at its inner end 60.

In this process, as depicted, securing member 54 is displaced downward in bearing tube 30 and digs into the plastic material of bearing tube 30, so that it latches or locks the entire bearing arrangement in bearing tube 30. If an attempt were made to pull rotor 26 out of bearing tube 30 against force K, securing member 54 would only dig that much more deeply into the material of bearing tube 30; in other words, this is an extraordinarily secure attachment. There are, of course many different solutions and components for a permanent interlock of this kind, and securing element 54 depicted here therefore represents only a preferred implementation.

After pressing-in is complete, force K is removed and the situation according to FIG. 1 then results, i.e. spring 58 now once again pushes shaft 46 sufficiently that snap ring 59 once again abuts against inner ring 50i of rolling bearing 50. The "mating" process is then at an end. Spring 58 now clamps the two inner rings 48i, 50i of rolling bearings 48, 50 against one another, which is necessary for quiet running of motor 20.

As already stated, the same mounting method can also be used for the installation of conveying wheel 90, in which case a corresponding bearing tube must then also be provided for the conveying wheel; this represents an alternative (not depicted) to FIG. 1.

The great advantage of this mounting method is that, in accordance with FIG. 4, ball bearings 48, 50, spacer 52, and snap ring 59 can be preassembled as shown in FIG. 4. The preassembled parts can then be tested for reliable operation, and if that is achieved the preassembled rotor 26 (or preassembled conveying wheel 90) can easily be pressed into the associated bearing tube, eliminating the need for further installation work. This is therefore a very easy mounting method that contributes to a particularly compact design of the unit.

Figure 6:
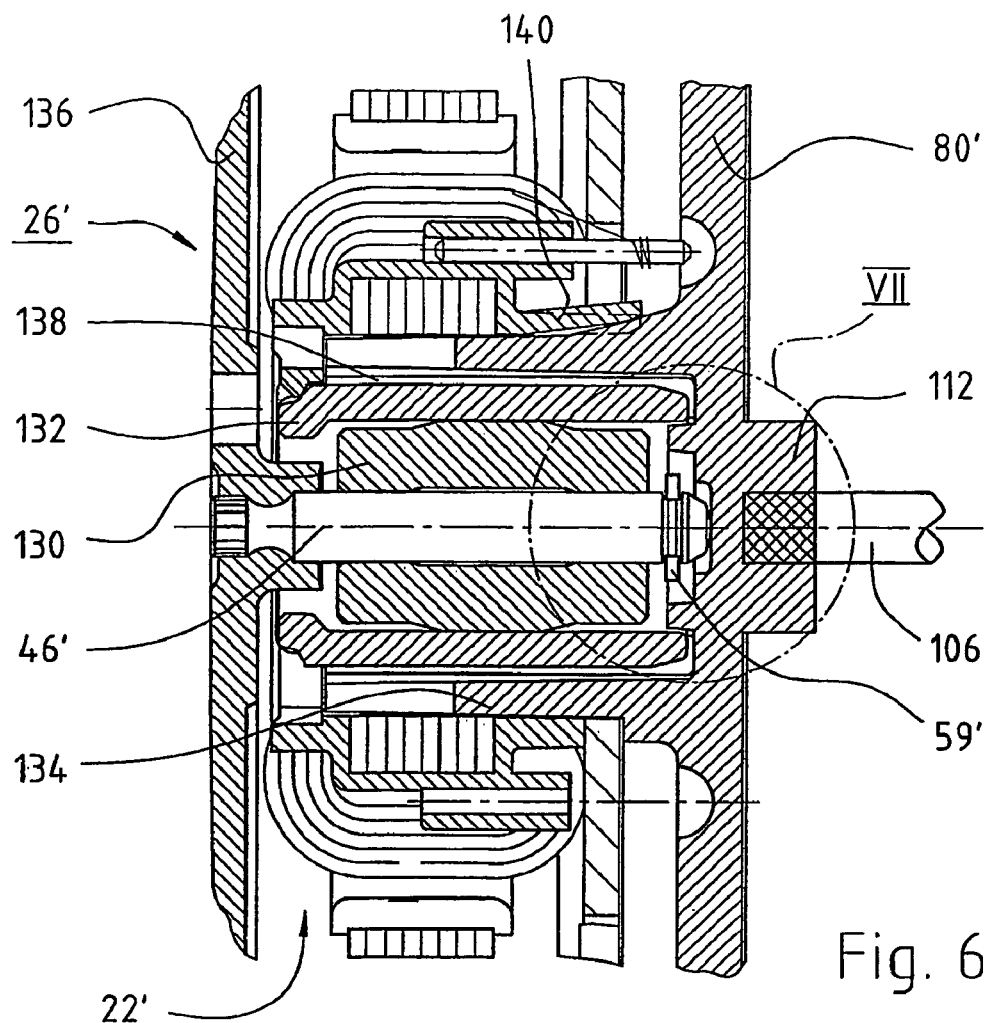
FIG. 6 is a depiction showing how a plain bearing can be installed from one end of motor 20.
Figure 7:
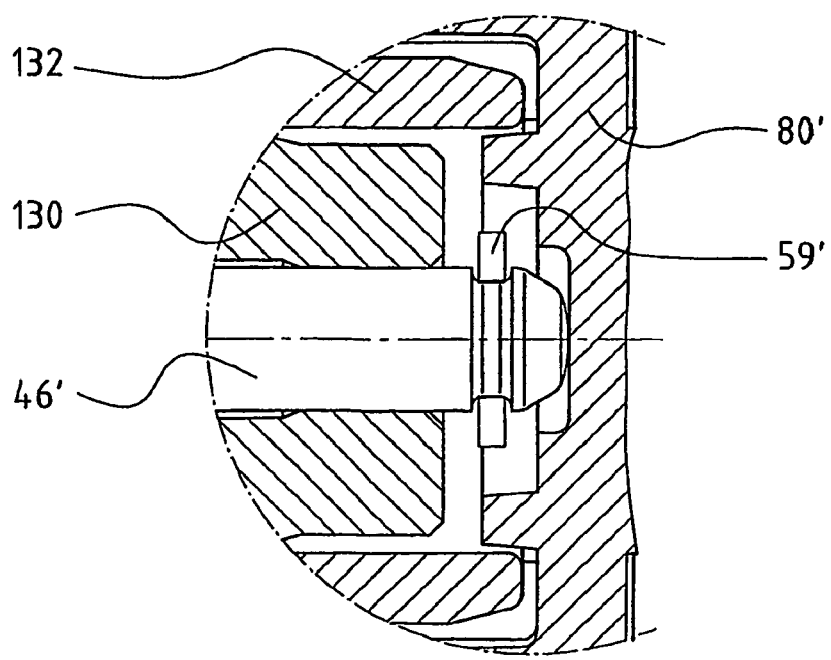
FIG. 7 shows a detail of FIG. 6 that is labeled VII therein.

FIGS. 6 and 7 show an analogous rotor mounting method in the case of an external-rotor motor 20' whose shaft 46' is journalled in a double sintered bearing 130. The latter is pressed into a bearing tube 132 in a predetermined axial position, and external rotor 26' is preassembled in a manner such that sintered bearing 130 together with bearing tube 132 is slid onto its shaft 46', and is then secured with snap ring 59'.

What is then obtained is a preassembled rotor approximately analogous to FIG. 4 having, however, not ball bearings but instead a plain bearing 130 that is located at a predetermined axial position in bearing tube 132.

A bearing tube fitting 134 is provided on portion 80' (made of plastic). This fitting is preferably implemented integrally with portion 80'. Fitting 134 extends over only approximately half the distance between portion 80' and bottom 136 of rotor cup 26'.

Pressed into this fitting 134, as shown in FIGS. 6 and 7, is outer rotor 26' with its bearing tube 132, already preassembled with plain bearing 130. Bearing tube 132 has on its exterior ribs 138 that are deformed as they are pressed in, and thereby bring about a secure fit and secure mounting.

As FIG. 6 shows, coil former 140 of internal stator 22' is then slid over bearing tube 132 and bearing tube fitting 134, and brings about additional retention.

In this fashion, it is also possible to easily pre-assemble a rotor 26' that is equipped with a plain bearing 130, and then to mount it in the fan, in the preassembled state, by pressing it in from one side. The same mounting method is of course also possible for conveying wheel 90, provided plain bearing 130 is compatible with the fluid being conveyed therein.

Many variants and modifications are of course possible within the scope of the present invention.

What is claimed is:

1. A multi-rotor motor structure having hermetically separated first and second modules, wherein
the first module comprises an electronically commutated external-rotor motor (20), having an internal stator (22) that is arranged on a bearing tube (30) and that is separated by a first air gap (24) from an external rotor (26; 92), a rotor cup (40), forming part of said external rotor, that is open at one end and is joined at its other end to a shaft (46) that is journalled in the bearing tube (30),
a permanent-magnet arrangement (76), arranged at the open end of the rotor cup (40), for magnetic interaction with a second permanent-magnet rotor (92) forming part of said second module and rotatably journalled in the motor structure, which permanent-magnet arrangement (76) is separated from that second rotor (92) by a second air gap and forms with it a magnetic coupling (94), so that a rotation of the permanent-magnet arrangement (76) brings about a rotation of that second rotor (92), and
a non-ferromagnetic separating element (82) arranged in the second air gap, wherein:
said separating element hermetically separates the second rotor (92) from the external-rotor motor (20);
said separating element is formed with a support (106) for journalling the second rotor (92), as well as with a support for the bearing tube (30; 134) for journalling the shaft (46; 46') of the rotor cup (40);
said separating element seals off a rotor-cup-remote end of said bearing tube (30); and
said shaft (46; 46') of said rotor cup (40) is secured (54, 59) against axial removal from said bearing tube (30).

2. The motor structure according to claim 1,
wherein said first module serves as a drive motor of a fan, and fan blades (64) are arranged on the external rotor (26).

3. The motor structure according to claim 2, wherein the fan blades (64) are joined to the rotor cup (40) by plastic injection molding.

4. The motor structure according to claim 1, wherein the permanent-magnet arrangement (76) arranged at the open end of the rotor cup (40) comprises plastic-matrix magnet material.

5. The motor structure according to claim 4, wherein the plastic-matrix magnet material (76) is joined to the rotor cup (40) by plastic injection molding.

6. The motor structure according to claim 3,
wherein the permanent-magnet arrangement (76) made of plastic-matrix magnet material, and the fan blades (64), are manufactured in successive molding steps.

7. The motor structure according to claim 1,
wherein the non-ferromagnetic separating element (80, 82, 84) is manufactured from plastic.

8. The motor structure according to claim 1, wherein the non-ferromagnetic separating element (80, 82, 84) is cup-shaped and has, on its side facing toward the external-rotor motor (20), no passage for liquid.

9. The motor structure according to claim 1, further comprising
fan blades (64) that, during operation, rotate within a fan housing (68) and are arranged on the external rotor (26); and wherein
the fan housing (68) is joined to the non-ferromagnetic separating element (80, 82, 84) via a plurality of struts (114, 116, 118).

10. The motor structure according to, claim 1, wherein the non-ferromagnetic separating element (80, 82, 84) is joined in liquid-tight fashion, on its side facing away from the external-rotor motor (20), to a cover (88).

11. The motor structure according to claim 1, wherein the second rotor (92) is coupled to a pump element (90; 99).

12. The motor structure according to claim 11, wherein the second rotor (92) is implemented integrally with at least one part of the pump element (90; 99).

13. The motor structure according to claim 1, wherein the second module comprises:
a conveying wheel (90) of a pump;
a shaft (106) which rotates during operation and is coupled to said conveying wheel (90); and
a bearing tube which is associated with said shaft of said conveying wheel, in order to journal said shaft (106).

14. The motor structure according to claim 1,
wherein the internal stator is sealed in fluid-tight fashion and is arranged in the fluid conveyed by the pump rotor (92), and is in direct interaction with the pump rotor (92) in order to drive it during operation.

15. The motor structure according to claim 14,
wherein the pump rotor (92) is in interaction, via an air gap, with the fan wheel (64) in order to drive the latter during operation in the manner of a magnetic coupling.

16. The motor structure according to claim 1, further comprising
a sintered bearing (130) supporting said shaft (46') of said external rotor (26), said bearing being supported, in turn, in a fitting (134) arranged on said separating element (80', 82).

17. The motor structure according to claim 16, further comprising, adjacent a free end of said shaft (46') extending from said sintered bearing (130), a securing element (59') which secures said shaft against removal from said sintered bearing.

18. The motor structure according to claim 16, wherein a well (109) is defined, surrounding said free end of said shaft (46').

19. The motor structure of claim 14, further comprising a coil former (140) for said internal stator (22'), serving to support a bearing tube (132) for said rotor shaft.

20. The motor structure of claim 16, wherein said bearing tube (132) is formed on its outer surface with ribs configured to deform during insertion of said bearing tube (132) into said fitting (134).

21. The motor structure of claim 1, further comprising
two rolling bearings (48, 50), each having a respective inner ring (48i, 50i) and a respective outer ring (48e, 50e), supporting said shaft (46) of said external rotor (26; 92) for rotation and axial movement therein, and
an annular spacer (52) located axially between said outer rings (48e, 50e).

22. The motor structure of claim 21, further comprising
a securing element (59) which, in an assembled configuration, rests against the inner ring (50i) of an adjacent rolling bearing (50).

23. The motor structure of claim 22, further comprising
a spring (58) which provides a preload against an inner ring (50i) of an adjacent rolling bearing (50).

24. The motor structure of claim 21, further comprising
a securing element (54) which secures an outer ring (48e) of one of said rolling bearings within bearing tube (30).

* * * * *